United States Patent
Lee et al.

(10) Patent No.: US 9,013,236 B2
(45) Date of Patent: Apr. 21, 2015

(54) OPERATIONAL TRANSCONDUCTANCE AMPLIFIER

(71) Applicant: National Chung Cheng University, Chia-Yi County (TW)

(72) Inventors: Shuenn-Yuh Lee, Chia-Yi County (TW); Cheng-Pin Wang, Kaohsiung (TW); Jia-Feng Tsai, Taichung (TW)

(73) Assignee: National Chung Cheng University, Chia-Yi County (TW)

( * ) Notice: Subject to any disclaimer, the term of this patent is extended or adjusted under 35 U.S.C. 154(b) by 17 days.

(21) Appl. No.: 13/965,445

(22) Filed: Aug. 13, 2013

(65) Prior Publication Data

US 2014/0361832 A1 Dec. 11, 2014

(30) Foreign Application Priority Data

Jun. 7, 2013 (TW) .............................. 102120398 U

(51) Int. Cl.
 *H03F 3/45* (2006.01)
(52) U.S. Cl.
 CPC ................................ *H03F 3/45179* (2013.01)
(58) Field of Classification Search
 CPC ........................................................ H03F 3/45
 USPC .................................... 330/253, 257, 261, 69
 See application file for complete search history.

(56) References Cited

U.S. PATENT DOCUMENTS

| | | | | |
|---|---|---|---|---|
| 5,844,442 A | * | 12/1998 | Brehmer | 330/258 |
| 8,350,626 B2 | * | 1/2013 | Shibata | 330/295 |
| 8,680,922 B2 | * | 3/2014 | Wan | 330/253 |

* cited by examiner

*Primary Examiner* — Henry Choe
(74) *Attorney, Agent, or Firm* — Muncy, Geissler, Olds & Lowe, P.C.

(57) ABSTRACT

An operational transconductance amplifier for connection with multiple input voltage sources includes a resistance simulation unit, two current cancellation units, a first differential output unit, two current division units, and a second differential output unit. The resistance simulation unit is to simulate resistance. The two current cancellation units are to receive and convert the voltage of the input voltage sources into two first currents. The two first currents flow to two first output ends of the first differential output unit, respectively. The two current division units are to receive and convert the voltage of the input voltage sources into two second currents. The two second currents flow to two second output ends of the two second differential output units, respectively, and include the same potential as the two first currents.

3 Claims, 5 Drawing Sheets

US 9,013,236 B2

OPERATIONAL TRANSCONDUCTANCE AMPLIFIER

BACKGROUND OF THE INVENTION

1. Field of the Invention

The present invention relates generally to an operational transconductance amplifier (OTA) and more particularly, to a multi-output OTA.

2. Description of the Related Art

The OTA is an amplifier capable of controlling output current based on input voltage and can be equivalent to a resistor and an active component in the circuit. Besides, none of any resistor is needed in the circuit design and the equivalent resistance can be acquired by control of bias current.

As shown in FIG. 1, a conventional OTA 10 is adapted for connection with multiple input voltage sources $V_{DD}$, $V_{inn}$, $V_{inp}$ and includes a source degeneration unit 12, two current cancellation units 13 and 14, two current division units 15 and 16, and a differential output unit 18. The input voltage source $V_{DD}$ is to provide voltage supply. The two input voltage sources $V_{inn}$ and $V_{inp}$ are to provide differential input voltage.

The source degeneration unit 12 includes three transistors 122, 124, 126, which are operated in the triode region to simulate resistance. Sources S of these transistors 122, 124, 126 are interconnected for receiving the voltage of the input voltage source $V_{DD}$. Gates G of these transistors 122, 124, 126 are interconnected. Each of the transistors 122 and 124 includes a node n1 or n2 at its drain D.

The current cancellation units 13 and 14 are connected with the two nodes n1 and n2 of the source degeneration unit 12 and the differential output unit 18. The two current cancellation units 13 and 14 can receive and convert the voltage of the input voltage sources $V_{inn}$ and $V_{inp}$ to generate an output current and the output current flows to output ends $V_{outp}$ and $V_{outn}$ of the differential output unit 18.

The two current division units 15 and 16 are connected with the two current cancellation units 13 and 14, respectively. The current division unit 16 is to convert the voltage of the input voltage sources $V_{inn}$ and $V_{inp}$ into current and conduct the current to the grounded ends to diminish the transconductance. Based on the technique of division, only a little output current is utilized, so the current utilization efficiency is lower. Besides, the two current division units 15 and 16 need larger layout area.

When small signal analysis is applied to the conventional OTA 10 shown in FIG. 1, it is known that all of small-signal electronic flows flow through the source degeneration unit 12 and a voltage stress $\Delta V$ is generated between the two nodes n1 and n2 of the source degeneration unit 12. In DC analysis, voltage stress $\Delta V$ of the source degeneration unit 12 is constant. When small-signal voltage is inputted, the voltage stress $\Delta V$ of the source degeneration unit 12 can be affected by the small-signal current $i_{Req}$, so if the ratio between the respective small-signal currents ($i_{Req}=i_{132}+i_{134}+i_{152}$) generated by the two current cancellation units 13 and 14 and the two current division units 15 and 16 is relatively constant, such small-signal currents can be more linear. Since left and right transistors of the OTA 10 shown in FIG. 1 are symmetrical, in the process of the small-signal analysis, one of the left and right transistors of the OTA 10 is analyzed only where the transconductance of the transistor is equal to the specific value of the output current to the input voltage. After the small-signal analysis, the transconductances $g_{132}$, $g_{134}$, $g_{152}$ of transistors 132, 134, 152 of the current cancellation unit 13 and the current division unit 15 can be acquired from the following equations.

$$g_{132} = \frac{1}{nV_T}\left(\frac{W}{L}\right)_{132} \cdot I_o \cdot \exp\left(\frac{V_{SG}}{nV_T}\right)\left[1 - \exp\left(-\frac{V_S - V_{outn}}{V_T}\right)\right]$$

$$g_{134} = \frac{1}{nV_T}\left(\frac{W}{L}\right)_{134} \cdot I_o \cdot \exp\left(\frac{V_{SG}}{nV_T}\right)\left[1 - \exp\left(-\frac{V_S - V_{outp}}{V_T}\right)\right]$$

$$g_{152} = \frac{1}{nV_T}\left(\frac{W}{L}\right)_{152} \cdot I_o \cdot \exp\left(\frac{V_{SG}}{nV_T}\right)\left[1 - \exp\left(-\frac{V_S - 0}{V_T}\right)\right]$$

$$g_{152} : g_{134} : g_{132} = \left(\frac{W}{L}\right)_{152}\left[1 - \exp\left(-\frac{V_S - 0}{V_T}\right)\right] :$$

$$\left(\frac{W}{L}\right)_{134}\left[1 - \exp\left(-\frac{V_S - V_{outp}}{V_T}\right)\right] : \left(\frac{W}{L}\right)_{132}\left[1 - \exp\left(-\frac{V_S - V_{outn}}{V_T}\right)\right]$$

where W denotes the physical width of the transistor, and L denotes the physical length of the transistor.

The two current division units 15 and 16 are directly grounded to make the transconductance thereof be greatly affected by voltage of source end $V_s$ as indicated in the aforesaid equation $g_{152}$. In other words, if the input voltage $V_{DD}$ is changed, the transconductance of $g_{152}$ will be directly affected, indicating that the transconductance of the conventional OTA 10 is not only affected by the physical dimension of the transistor but the variation of the input voltage.

As illustrated in FIG. 2, to realize a third-order low-pass differential transconductance capacitive filter 40, seven conventional OTAs 401-407 and three capacitors 421-423 are needed.

SUMMARY OF THE INVENTION

The primary objective of the present invention is to provide an OTA, which can provide multiple output currents of identical potential and decrease required number of elements and power consumption while applied to the analog filter and the sigma-delta analog-to-digital converter.

The foregoing objective of the present invention is attained by the OTA connected with multiple voltage sources and formed of a resistance simulation unit, two current cancellation units, a first differential output unit, two current division units, and a second differential output unit. The resistance simulation unit is to simulate resistance. The two current cancellation units are connected with the resistance simulation unit, for receiving the voltage of the voltage sources and converting the voltage sources into two first currents. The first differential output unit is connected with the two current cancellation units and includes two first output ends. The two first currents flow to the two first output ends, respectively. The two current division units are connected with the two current cancelation units, respectively, for receiving the voltage of the voltage sources and converting the voltage sources into two second currents. The two differential output units are connected with the two current division units and include two output ends. The two second currents flow to the two second output ends, respectively, and include the same potential as the two first currents.

DETAILED DESCRIPTION OF PREFERRED EMBODIMENTS

Structural features and desired effects of the present invention will become more fully understood by reference to two preferred embodiments given hereunder. However, it is to be understood that these embodiments are given by way of illustration only, thus are not limitative of the claim scope of the present invention.

Figure 1:
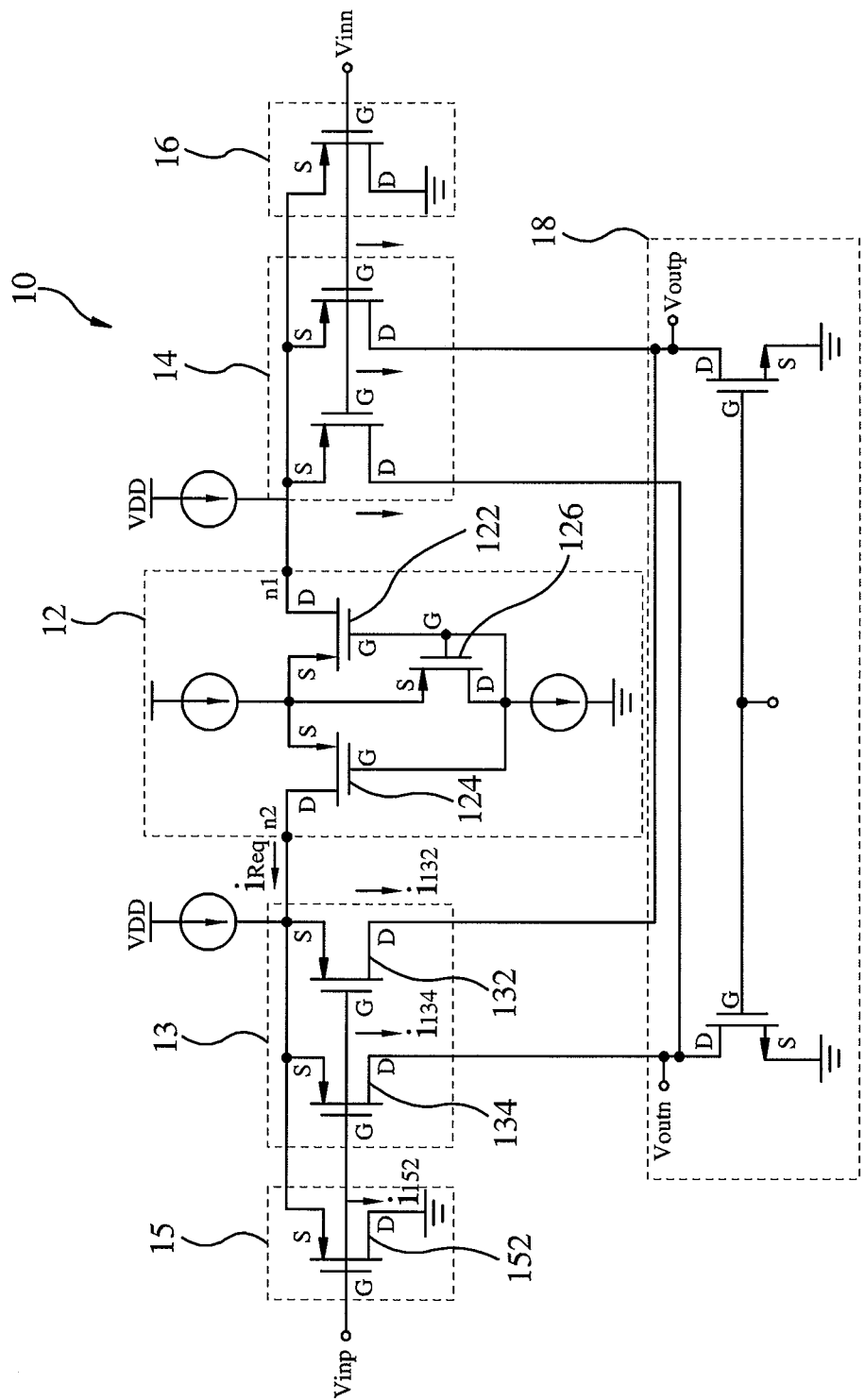
FIG. 1 is a schematic circuit diagram of a conventional OTA.
Figure 2:
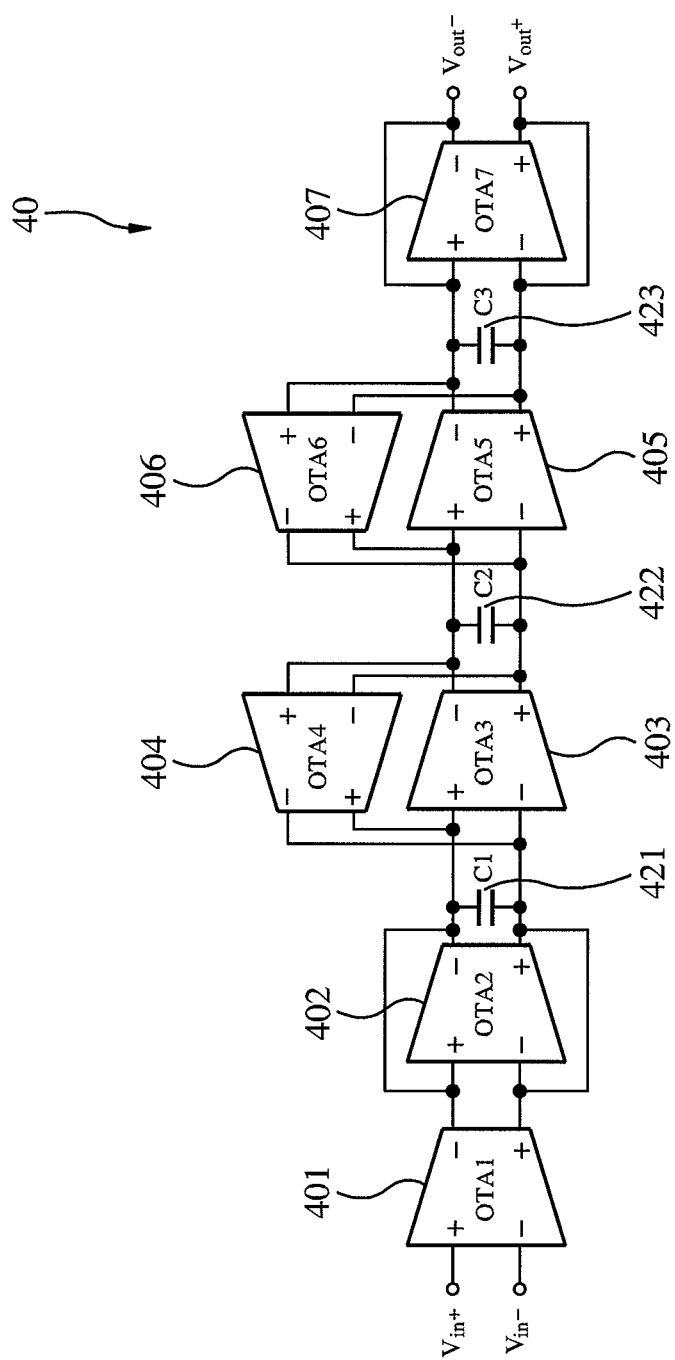
FIG. 2 is a schematic circuit diagram of the conventional OTA applied to a three-order low-pass differential transconductance capacitive filter.
Figure 3:
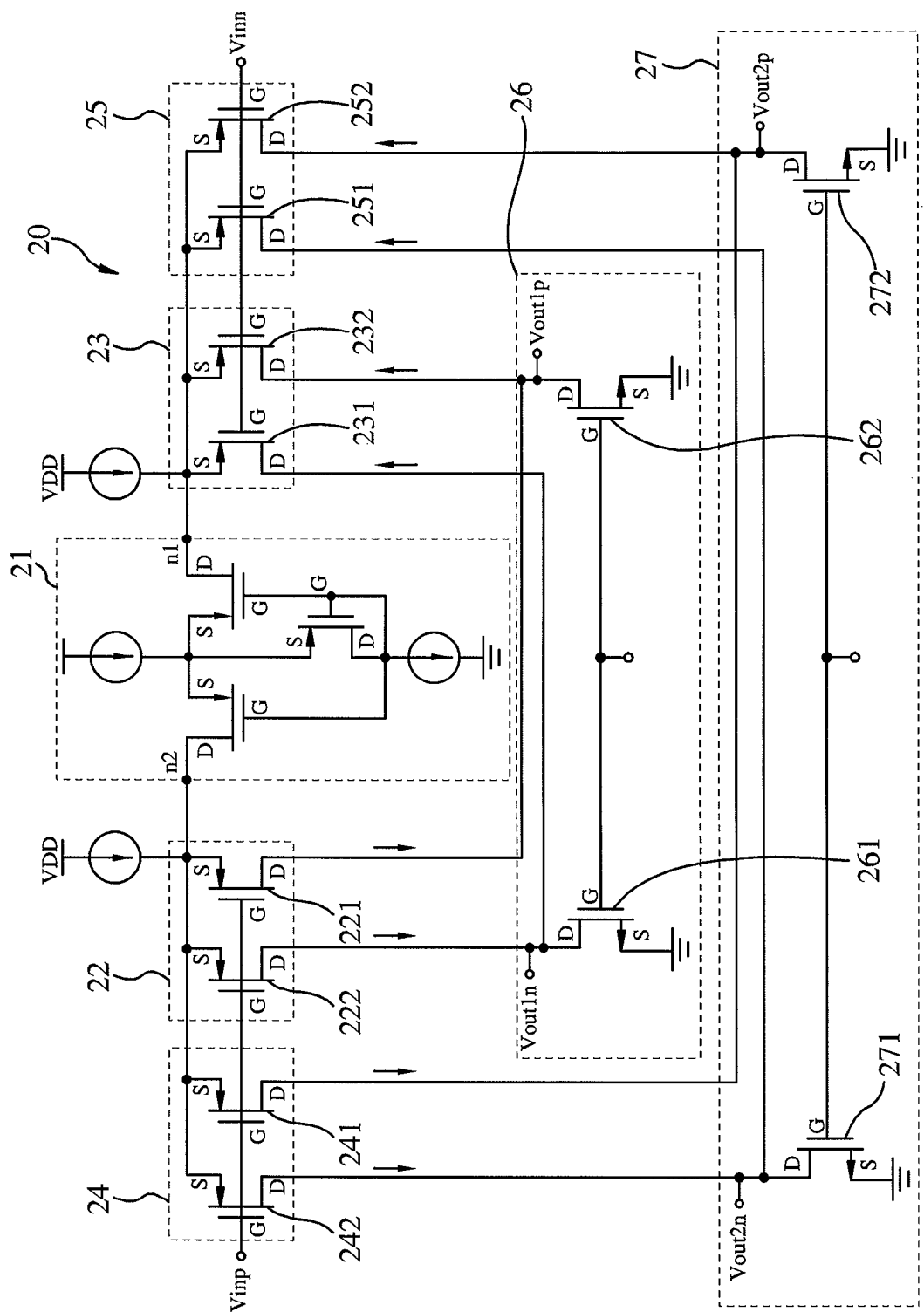
FIG. 3 is a schematic circuit diagram of a first preferred embodiment of the present invention.

Referring to FIG. 3, an OTA 20 constructed according to a first preferred embodiment of the present invention can be connected with multiple input voltage sources $V_{inn}$ and $V_{inp}$ and includes a resistance simulation unit 21, two current cancellation units 22 and 23, two current division units 24 and 25, a first differential output unit 26, and a second differential output unit 27. The detailed descriptions and operations of these elements as well as their interrelations are recited in the respective paragraphs as follows.

The resistance simulation unit 21 can simulate resistance and includes two nodes n1 and n2. In this preferred embodiment, the resistance simulation unit 21 adopts a circuit identical to the source degeneration unit of the conventional OTA, so the recitation in this regard is skipped. However, the resistance simulation unit 21 can adopt another circuit of resistance simulation.

The two current cancellation units 22 and 23 are connected with the two nodes n1 and n2 of the resistance simulation unit 21 and the first differential output unit 26. The two current cancellation units 22 and 23 include two first transistors 221 and 222 and two second transistors 231 and 232. Sources S of the two first transistors 221 and 222 are connected with one of the two nodes n1 and n2 and sources of the two second transistors 231 and 232 are connected with the other node n1 or n2. Gates G of the two first transistors 221 and 222 are connected with the input voltage source $V_{inn}$. Gates G of the two second transistors 231 and 232 are connected with the input voltage source $V_{inp}$. Drain D of the first transistor 221 is connected with drain D of the second transistor 232. Drain D of the first transistor 222 is connected with drain D of the second transistor 231.

The first differential output unit 26 includes two first differential transistors 261 and 262 and two first differential transistors $V_{out1p}$ and $V_{out1n}$. Sources S of the two first differential transistors 261 and 262 are grounded. Gates G of the two first differential transistors 261 and 262 are interconnected. Drains D of the two first differential transistors 261 and 262 are connected with the drains D of the first and second transistors 222 and 232, respectively. The two first output ends $V_{out1p}$ and $V_{out1n}$ are connected with drains D of the two first differential transistors 261 and 262, respectively.

The two current cancellation units 22 and 23 can receive and convert the voltage of the input voltage sources $V_{inn}$ and $V_{inp}$ into two first currents, one of which is the sum of the current of the drain D of the first transistor 221 and the current of the drain D of the second transistor 232 and the other is the sum of the current of the drain D of the first transistor 222 and the current of the drain D of the second transistor 231. The two first currents flow to the two first output ends $V_{out1p}$ and $V_{out1n}$ of the first differential output unit 26, respectively.

The two current division units 24 and 25 are connected with the two current cancellation units 22 and 23 and the second differential output unit 27 and include two third transistors 241 and 242 and two fourth transistors 251 and 252. Sources S of the two third transistors 241 and 242 are connected with the source S of the transistor 222. Sources S of the two fourth transistors 251 and 252 are connected with the source S of the transistor 232. Gates G of the two third transistors 241 and 242 are connected with the input voltage source $V_{inp}$. Gates G of the two fourth transistors 251 and 252 are connected with the input voltage source V. Drain D of the third transistor 241 is connected with drain D of the fourth transistor 252. Drain D of the third transistor 242 is connected with drain D of the fourth transistor 251.

The second differential output unit 27 includes two second differential transistors 271 and 272 and two second output ends $V_{out2p}$ and $V_{out2n}$. Sources S of the two second differential transistors 271 and 272 are grounded. Gates G of the two second differential transistors 271 and 272 are interconnected. Drains D of the two second differential transistors 271 and 272 are connected with the drains D of the third and fourth transistors 242 and 252, respectively. The two second output ends $V_{out2p}$ and $V_{out2n}$ are connected with drains D of the two second differential transistors 272 and 271, respectively. The two current division units 24 and 25 can receive and convert the voltage of the input voltage sources $V_{inn}$ and $V_{inp}$ into two second currents. The two second currents can flow to the two second output ends $V_{out2p}$ and $V_{out2n}$. It is to be noted that the two first currents and the two second currents have the same DC potential each.

Since the transistors at left and right sides of the OTA 20 shown in FIG. 3 are symmetrical, in the process of the small-signal analysis, only the left or right transistors are analyzed. In this embodiment, the transconductances $g_{221}$, $g_{222}$, $g_{241}$, $g_{242}$ of the left transistors 221, 222, 241, 242 are analyzed and acquired from the following equations.

$$g_{242} = \frac{1}{nV_T}\left(\frac{W}{L}\right)_{242} \cdot I_o \cdot \exp\left(\frac{V_S - V_{inp}}{nV_T}\right)\left[1 - \exp\left(-\frac{V_S - V_{out2n}}{V_T}\right)\right]$$

$$g_{241} = \frac{1}{nV_T}\left(\frac{W}{L}\right)_{241} \cdot I_o \cdot \exp\left(\frac{V_S - V_{inp}}{nV_T}\right)\left[1 - \exp\left(-\frac{V_S - V_{out2p}}{V_T}\right)\right]$$

$$g_{221} = \frac{1}{nV_T}\left(\frac{W}{L}\right)_{221} \cdot I_o \cdot \exp\left(\frac{V_{SG}}{nV_T}\right)\left[1 - \exp\left(-\frac{V_S - V_{out1p}}{V_T}\right)\right]$$

$$g_{222} = \frac{1}{nV_T}\left(\frac{W}{L}\right)_{222} \cdot I_o \cdot \exp\left(\frac{V_{SG}}{nV_T}\right)\left[1 - \exp\left(-\frac{V_S - V_{out1n}}{V_T}\right)\right]$$

$$g_{242} : g_{241} : g_{221} : g_{222} =$$

$$\left(\frac{W}{L}\right)_{242}\left[1 - \exp\left(-\frac{V_S - V_{out2n}}{V_T}\right)\right] : \left(\frac{W}{L}\right)_{241}\left[1 - \exp\left(-\frac{V_S - V_{out2p}}{V_T}\right)\right] :$$

$$\left(\frac{W}{L}\right)_{222} \cdot \left[1 - \exp\left(-\frac{V_S - V_{out1p}}{V_T}\right)\right] : \left(\frac{W}{L}\right)_{222}\left[1 - \exp\left(-\frac{V_S - V_{out1n}}{V_T}\right)\right]$$

As known from each of the transconductances acquired through the aforesaid small-signal analysis, these transconductances are more susceptible to the physical dimension of the transistors and less susceptible to the input voltage source $V_{DD}$. In this way, the linearity of the OTA 20 of the present invention can be enhanced more than that of the conventional OTA.

Figure 4:
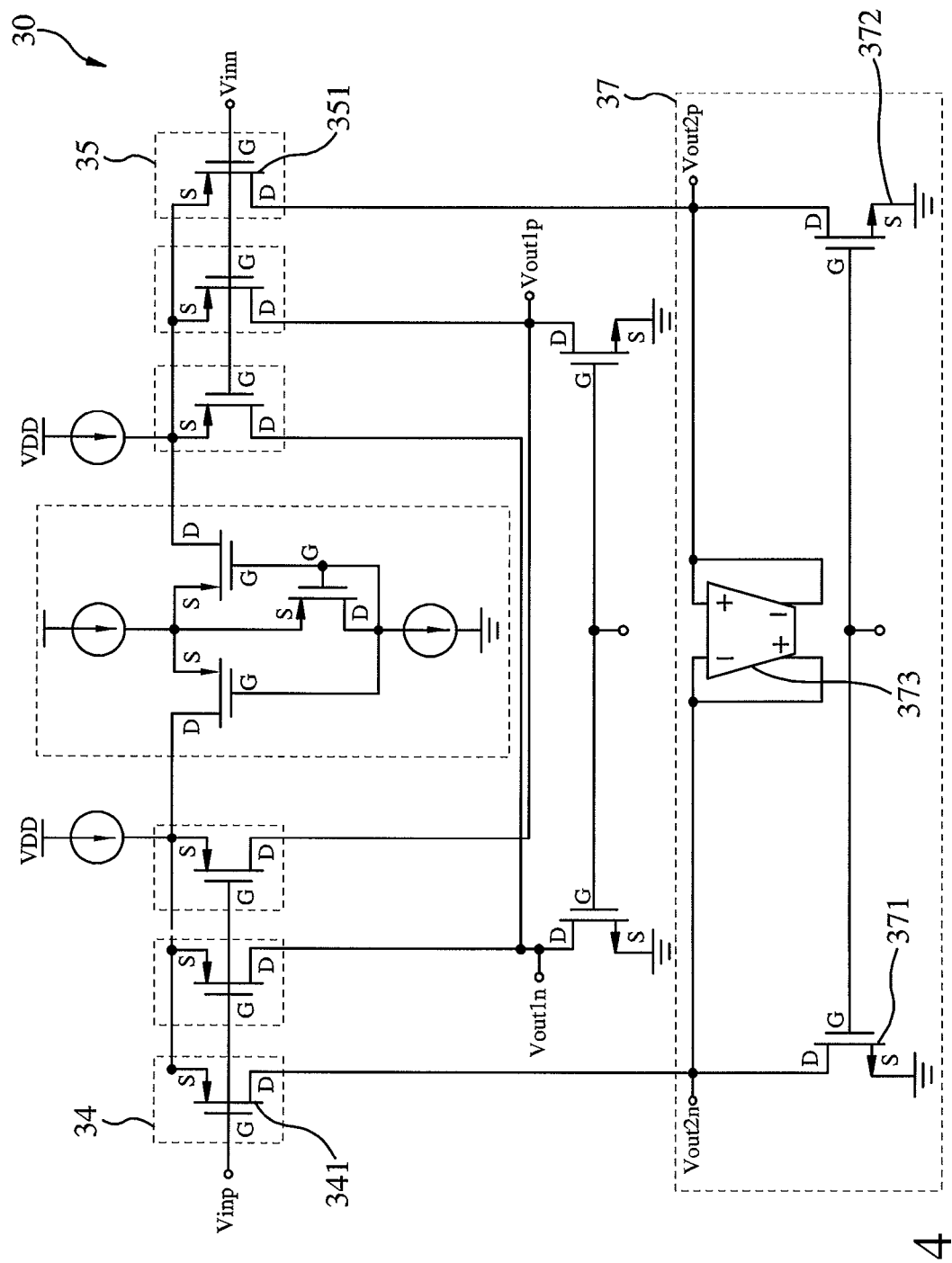
FIG. 4 is a schematic circuit diagram of a second preferred embodiment of the present invention.

Referring to FIG. 4, an OTA 30 constructed according to a second preferred embodiment of the present invention is similar to the OTA 20 of the first preferred embodiment, having the following differences. The two current division units 34 and 35 only include one third transistor 341 and one fourth transistor 351. The second differential output unit 37 further includes an active load OTA 373 connected with drains D of two second differential transistors 371 of the second differential output unit 37. Drains D of the third and fourth transistors 341 and 351 are connected with the drains D of the two second differential transistors 371 and 372. In this way, the active load OTA 373 can function as providing differential output ends $V_{out2p}$ and $V_{out2n}$ with the same DC potential to increase the linearity of the OTA 30.

Figure 5:
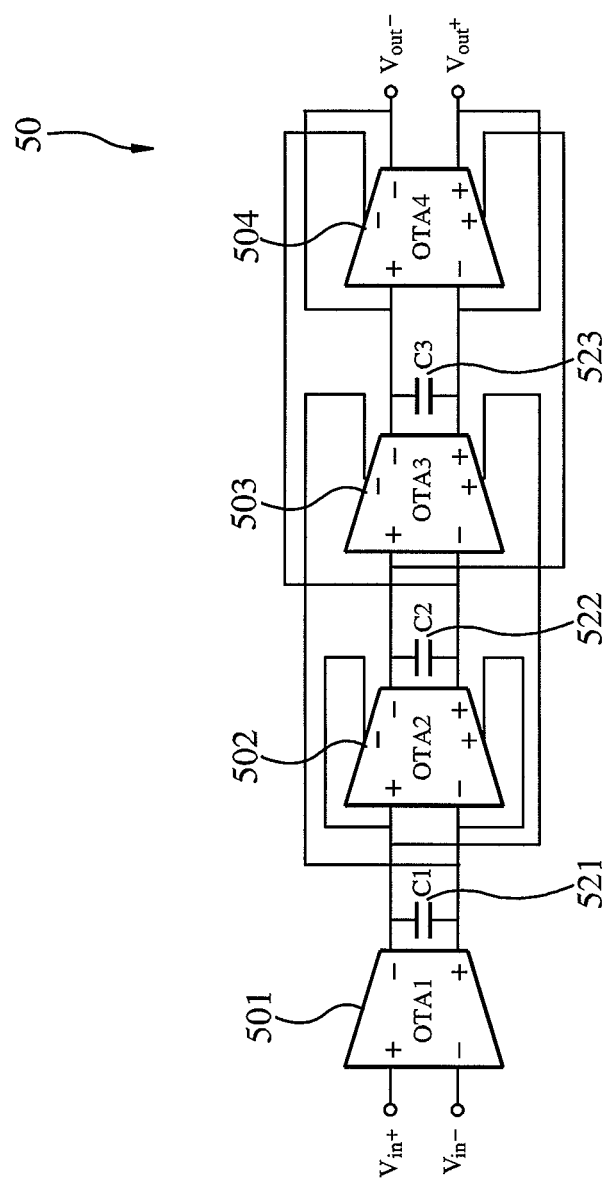
FIG. 5 is a schematic circuit diagram of the present invention applied to a third-order low-pass multi-output and differential input transconductance capacitive filter.

Compared with the prior art, as shown in FIG. 5, the OTA of the present invention includes multiple differential outputs, so only four OTAs 501-504 of the present invention and three capacitors 521-523 are needed to realize a three-order low-pass differential transconductance capacitive filter 50. Therefore, the required number and power consumption of the OTAs can be reduced to keep the linearity of the filter circuit.

What is claimed is:

1. An operational transconductance amplifier (OTA) for connection with multiple input voltage sources, the OTA comprising:
   a resistance simulation unit for simulating resistance;
   two current cancellation units connected with the resistance simulation unit respectively for receiving and converting the voltage of the input voltage sources into two first currents;
   a first differential output unit connected with the two current cancellation units respectively and having two first output ends, the two first currents flowing to the two first output ends;
   two current division units connected with the two current cancellation units respectively for receiving and converting the voltage of the input voltage sources into two second currents; and
   a second differential output unit connected with the two current division units respectively and having two second output ends, the two second currents flowing to the two second output ends and having the same potential as the two first currents,
   wherein the two current cancellation units comprise two first transistors and two second transistors, sources of the first and second transistors being connected with the resistance simulation unit, gates of the two first transistors being connected with one of the input voltage sources, gates of the two second transistors being connected with one of the input voltage sources, drain of one of the two first transistors being connected with drain of one of the two second transistors, drain of the other first transistor being connected with drain of the other second transistor; the first differential output unit comprises two first differential transistors, sources of the two first differential transistors being grounded, gates of the two first differential transistors being interconnected, drains of the two first differential transistors being connected with the drain of the other first transistor and the drain of the other second transistor respectively, the two first output ends being connected with drains of the two first differential transistors.

2. The OTA as defined in claim 1, wherein the two current division units comprise two third transistors and two fourth transistors, sources of the two third transistors being connected with the sources of the two first transistors, sources of the two fourth transistors being connected with the sources of the two second transistors, gates of the two third transistors being connected with one of the input voltage sources, gates of the two fourth transistors being connected with one of the input voltage sources, drain of one of the two third transistors being connected with drain of one of the two fourth transistors, drain of the other third transistor being connected with drain of the other fourth transistors; the second differential output unit comprises two second differential transistors, sources of the two second differential transistors being grounded, gates of the two second differential transistors being interconnected, drains of the two second differential transistors being connected with the drain of one of the third transistor and the drain of one of the fourth transistor respectively, the second output end being connected with the drains of the two second differential transistors.

3. The OTA as defined in claim 1, wherein the two current division units comprises a first third transistor and a fourth transistor, source of the third transistor being connected with sources of the two first transistors, source of the fourth transistor being connected with sources of the two second transistors, gate of the third transistor being connected with one of the input voltage sources, gate of the fourth transistor being connected with one of the input voltage sources; the second differential output unit comprises two second differential transistors and an active load OTA, sources of the two second differential transistors being grounded, gates of the two second differential transistors being interconnected, drains of the two second differential transistors being connected with drain of the third transistor and drain of the fourth transistor respectively, the two second output ends being connected with drains of the second differential transistors.

* * * * *